US008294500B1

(12) United States Patent
Ho et al.

(10) Patent No.: US 8,294,500 B1
(45) Date of Patent: Oct. 23, 2012

(54) MULTI-PHASE INTERPOLATORS AND RELATED METHODS

(75) Inventors: Vinh Van Ho, San Jose, CA (US); Tien Duc Pham, San Jose, CA (US); Tim Tri Hoang, San Jose, CA (US); Van Ton-That, San Jose, CA (US)

(73) Assignee: Altera Corporation, San Jose, CA (US)

( * ) Notice: Subject to any disclaimer, the term of this patent is extended or adjusted under 35 U.S.C. 154(b) by 26 days.

(21) Appl. No.: 12/621,493

(22) Filed: Nov. 18, 2009

Related U.S. Application Data

(60) Provisional application No. 61/255,231, filed on Oct. 27, 2009.

(51) Int. Cl.
*H03H 11/16* (2006.01)

(52) U.S. Cl. ........................................ 327/231; 327/237

(58) Field of Classification Search ........................ None
See application file for complete search history.

(56) References Cited

U.S. PATENT DOCUMENTS

| | | | | |
|---|---|---|---|---|
| 6,111,445 | A | 8/2000 | Zerbe et al. | |
| 6,359,486 | B1 * | 3/2002 | Chen | 327/231 |
| 6,621,312 | B2 * | 9/2003 | Tang et al. | 327/156 |
| 6,943,606 | B2 * | 9/2005 | Dunning et al. | 327/231 |
| 7,078,949 | B2 * | 7/2006 | Kim et al. | 327/158 |
| 7,135,905 | B2 | 11/2006 | Teo et al. | |
| 7,180,352 | B2 * | 2/2007 | Mooney et al. | 327/237 |
| 7,271,634 | B1 * | 9/2007 | Daga et al. | 327/149 |
| 7,385,432 | B2 * | 6/2008 | Mack et al. | 327/408 |
| 7,409,012 | B2 | 8/2008 | Martin et al. | |
| 7,532,053 | B2 | 5/2009 | Rausch | |
| 7,872,515 | B1 * | 1/2011 | Kuo | 327/237 |
| 7,994,837 | B1 | 8/2011 | Ho et al. | |
| 2009/0179674 | A1 * | 7/2009 | Tamura et al. | 327/155 |
| 2009/0238307 | A1 * | 9/2009 | Singh | 375/332 |

OTHER PUBLICATIONS

Muneo Fukaishi, et al., "A 20-Gb/s CMOS Multichannel Transmitter and Receiver Chip Set for Ultra-High-Resolution Digital Displays," IEEE Journal of Solid-State Circuits, vol. 35, No. 11, Nov. 2000, pp. 1611-1618.
Rainer Kreienkamp, et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.
Stefanos Sidiropoulos, et al., "A Semidigital Dual Delay-Locked Loop," IEEE Journal of Solid-State Circuits, vol. 32, No. 11, Nov. 1997, pp. 1683-1692.
Kostas Pagiamtzis, "ECE1352 Analog Integrated Circuits Reading Assignment: Phase Interpolating Circuits," Nov. 12, 2001, pp. 1-19.

* cited by examiner

*Primary Examiner* — Cassandra Cox
(74) *Attorney, Agent, or Firm* — Steven J. Cahill

(57) ABSTRACT

A phase interpolator circuit includes first and second transistors coupled to form a differential pair, a load circuit, a first set of switch circuits, a second set of switch circuits, and a current source. The first set of switch circuits are coupled between the first transistor and the load circuit. The second set of switch circuits are coupled between the second transistor and the load circuit. The current source provides current for the differential pair.

23 Claims, 12 Drawing Sheets

MULTI-PHASE INTERPOLATORS AND RELATED METHODS

BACKGROUND

The present invention relates to electronic circuits, and more particularly, to multi-phase interpolators and related methods.

A digital periodic clock signal is often used to sample a data signal that is transmitted to an integrated circuit from an external source. Different techniques can be used to align the rising and falling edges of the clock signal with respect to a sampling window of the data signal so that the data signal can be sampled accurately. As the clock signal frequency and the data rate increase, the sampling window decreases, and the sampling timing is more constrained. A phase interpolator circuit is an example of a circuit that can be used to generate a desired phase shift in a high frequency sampling clock signal.

FIG. 1A illustrates a prior art phase interpolator system. The system of FIG. 1A includes a control block 10, a multiplexer block 15, slew rate circuits 21-24, and phase interpolator 30. The system of FIG. 1A was fabricated in the Stratix® IV GX field programmable gate array manufactured by Altera Corporation of San Jose, Calif. Phase interpolator 30 includes two differential pairs formed by n-channel MOSFETs 41-44 and variable current sources 51-52.

A phase interpolator circuit can generate any one of a number of different phases in a periodic output signal in response to periodic input signals. A phase interpolator circuit can generate a sinusoidal output voltage signal $V_{OUT}$ that is a weighted sum of two sinusoidal voltage input signals, as shown in equations (1)-(3).

$$V_{OUT}=(\alpha\times\sin(\omega t))+(\beta\times\cos(\omega t))=c\times\sin(\omega t+\theta) \quad (1)$$

$$c=\sqrt{\alpha^2+\beta^2} \quad (2)$$

$$\theta=\arctan(\beta/\alpha) \quad (3)$$

The phase interpolator can generate a phase shift θ in $V_{OUT}$ between 0° and 360° relative to an input clock signal. A desired phase shift in $V_{OUT}$ can be generated by setting the values of the control codes α and β as a weighted summation of two variable current sources, such as current sources 51-52.

In the system of FIG. 1A, multiplexers in multiplexer block 15 select four of the clock signals C0, C45, C90, C135, C180, C225, C270, and C315 as output clock signals CLKA, CLKB, CLKC, and CLKD based on control signals from control block 10. The four selected clock signals CLKA, CLKB, CLKC, and CLKD are transmitted to slew rate circuits 21-24. Slew rate circuits 21-24 convert clock signals CLKA, CLKB, CLKC, and CLKD into four signals that are more sinusoidal in shape. The four sinusoidal signals are transmitted to the gate terminals of transistors 41-44 in phase interpolator 30 as cos ωt, −cos ωt, sin ωt, and −sin ωt, respectively. Phase interpolator 30 generates periodic output signals OUT0 and OUT180.

The four selected clock signals CLKA, CLKB, CLKC, and CLKD determine which one of 8 different 45° wide regions RG0-RG7 between 0° and 360° the phase shift in OUT0 occurs in. FIG. 1B illustrates the 8 regions RG0-RG7 between 0° and 360°. Clock signals C0, C45, C90, C135, C180, C225, C270, and C315 have relative phases of 0°, 45°, 90°, 135°, 180°, 225°, 270°, and 315°, respectively. Multiplexer block 15 selects the 4 clock signals shown in one of the columns of Table 1 below as clock signals CLKA, CLKB, CLKC, and CLKD to generate a phase shift in OUT0 that is within the region indicated in the top row of that column.

TABLE 1

| Region | RG0 | RG1 | RG2 | RG3 | RG4 | RG5 | RG6 | RG7 |
|---|---|---|---|---|---|---|---|---|
| cosωt | C0 | C45 | C90 | C135 | C180 | C225 | C270 | C315 |
| −cosωt | C180 | C225 | C270 | C315 | C0 | C45 | C90 | C135 |
| sinωt | C45 | C90 | C135 | C180 | C225 | C270 | C315 | C0 |
| −sinωt | C225 | C270 | C315 | C0 | C45 | C90 | C135 | C180 |

Control block 10 includes an 8-bit shift register that controls the weight current ratios of current sources 51-52 and a 3-bit counter that selects the region RG0-RG7 that the phase of OUT0 is generated in. The currents through current sources 51-52 are varied to change the phase shift of OUT0 within the selected region RG0-RG7.

BRIEF SUMMARY

According to some embodiments, a phase interpolator circuit includes first and second transistors coupled to form a differential pair, a load circuit, a first set of switch circuits, a second set of switch circuits, and a current source. The first set of switch circuits are coupled between the first transistor and the load circuit. The second set of switch circuits are coupled between the second transistor and the load circuit. The current source provides current for the differential pair.

According to other embodiments, a phase interpolator circuit includes first and second transistors that are coupled to form a first differential pair and third and fourth transistors that are coupled to form a second differential pair. A first switch circuit is coupled to the first transistor and to a load circuit. A second switch circuit is coupled between the first switch circuit and the third transistor. A third switch circuit is coupled to the second transistor and to a load circuit. A fourth switch circuit is coupled between the third switch circuit and the fourth transistor. A fifth switch circuit is coupled to the first transistor and to a load circuit. A sixth switch circuit is coupled between the fifth switch circuit and the third transistor. A seventh switch circuit is coupled to the second transistor and a load circuit. An eighth switch circuit is coupled between the seventh switch circuit and the fourth transistor.

Various objects, features, and advantages of the present invention will become apparent upon consideration of the following detailed description and the accompanying drawings.

DETAILED DESCRIPTION

Figure 1A:
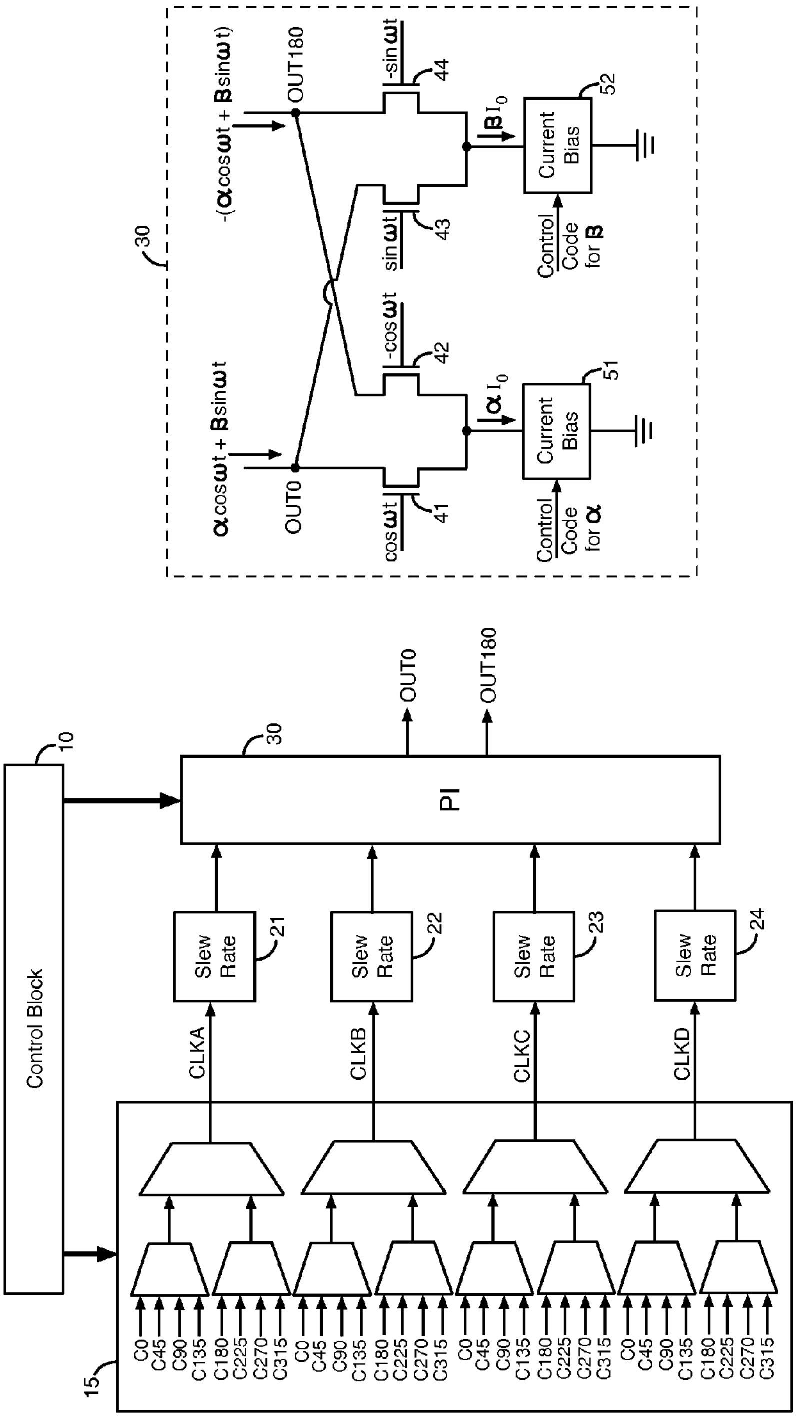
FIG. 1A (Prior Art)
FIG. 1A illustrates a prior art phase interpolator system.
Figure 1B:
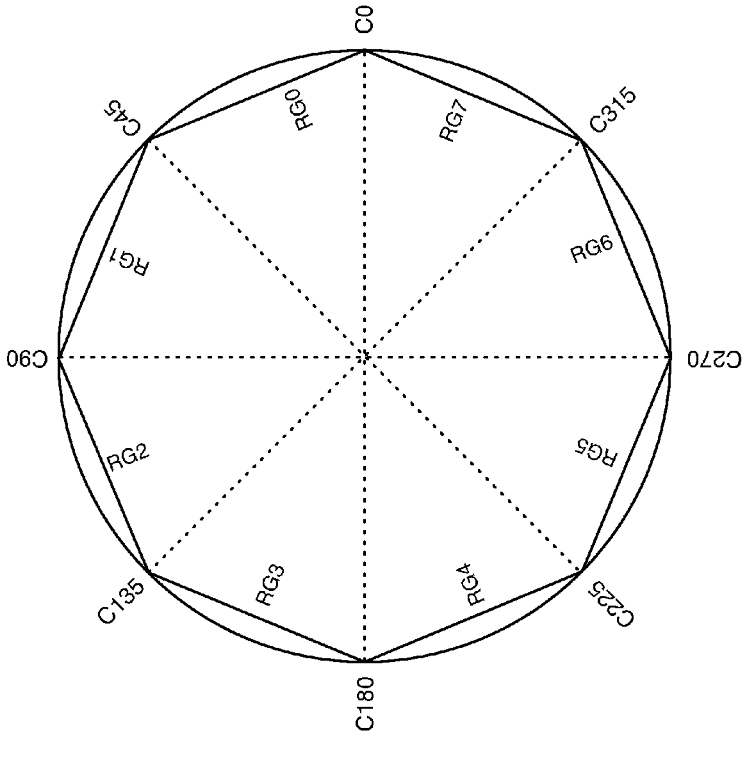
FIG. 1B (Prior Art)
FIG. 1B illustrates the 8 regions RG0-RG7 between 0° and 360°.
Figure 2:
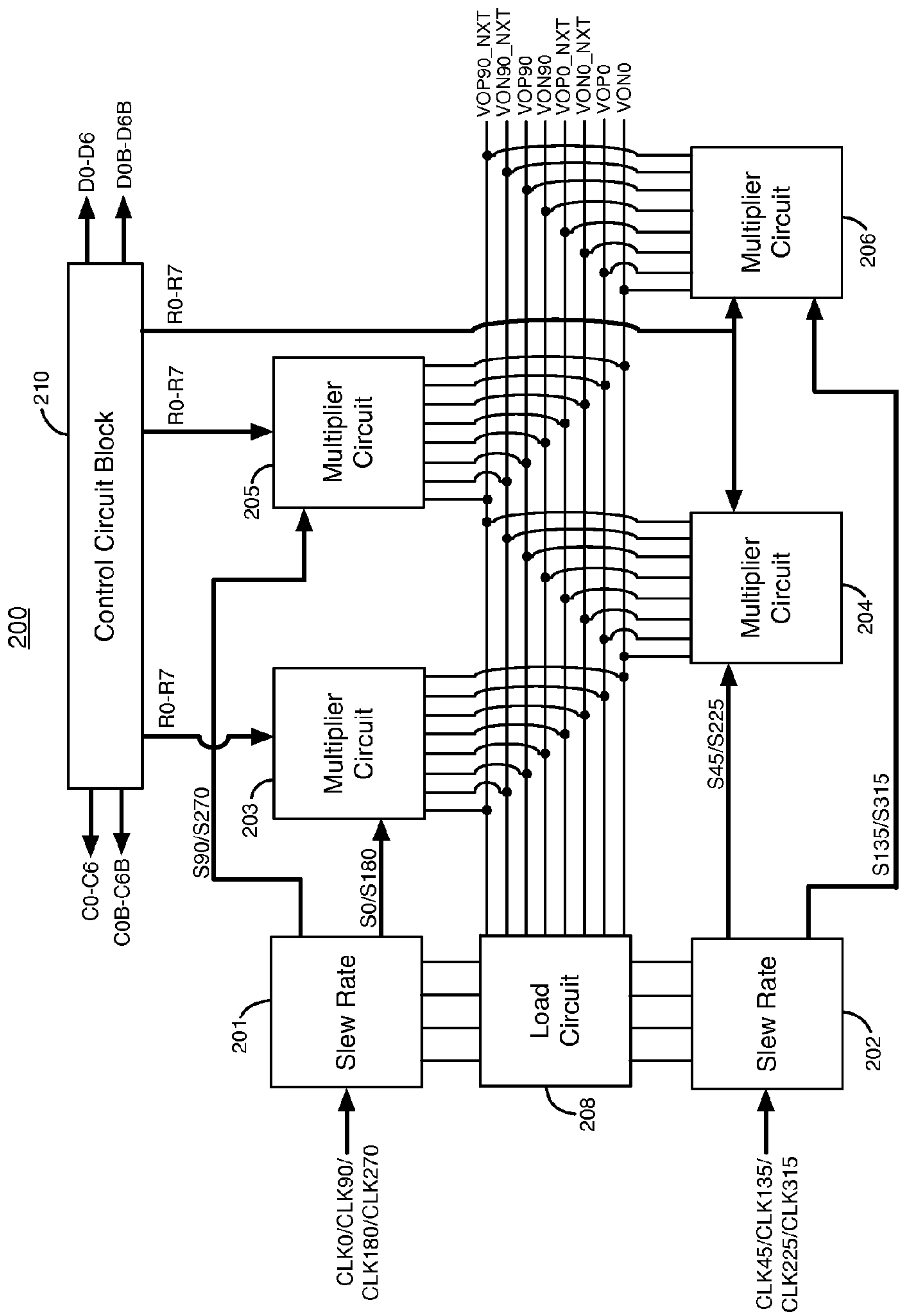
FIG. 2 illustrates an example of a phase interpolator circuit, according to an embodiment of the present invention.

FIG. 2 illustrates an example of a phase interpolator circuit 200, according to an embodiment of the present invention. Phase interpolator circuit 200 includes slew rate circuits 201-202, multiplier circuits 203-206, load circuit 208, and control circuit block 210. Phase interpolator 200 receives 8 digital periodic clock signals CLK0, CLK45, CLK90, CLK135, CLK180, CLK225, CLK270, and CLK315. Each of the clock signals CLK0, CLK45, CLK90, CLK135, CLK180, CLK225, CLK270, and CLK315 is a voltage square wave that has a 50% duty cycle. Clock signals CLK0, CLK45, CLK90, CLK135, CLK180, CLK225, CLK270, and CLK315 are offset in phase at 45° phase intervals. Clock signals CLK0, CLK45, CLK90, CLK135, CLK180, CLK225, CLK270, and CLK315 have relative phases of 0°, 45°, 90°, 135°, 180°, 225°, 270°, and 315°, respectively. These clock signals can be generated by, for example, a voltage-controlled oscillator in a phase-locked loop or a voltage-controlled delay line in a delay-locked loop.

Slew rate circuits 201-202 convert clock signals CLK0, CLK45, CLK90, CLK135, CLK180, CLK225, CLK270, and CLK315 into 8 periodic sinusoidal voltage waveforms S0, S45, S90, S135, S180, S225, S270, and S315. Signals S0, S45, S90, 5135, S180, S225, S270, and S315 have relative phases of 0°, 45°, 90°, 135°, 180°, 225°, 270°, and 315°, respectively. Slew rate circuit 201 converts clock signals CLK0, CLK90, CLK180, and CLK270 into voltage signals S0, S90, S180, and S270, respectively. Slew rate circuit 202 converts clock signals CLK45, CLK135, CLK225, and CLK315 into voltage signals S45, S135, S225, and S315, respectively. Voltage signals S0, S45, S90, S135, S180, S225, S270, and S315 are more sinusoidal in shape than the 8 input clock signals.

Sinusoidal voltage signals S0 and S180 are transmitted to inputs of multiplier circuit 203. Sinusoidal voltage signals S90 and S270 are transmitted to inputs of multiplier circuit 205. Sinusoidal voltage signals S45 and S225 are transmitted to inputs of multiplier circuit 204. Sinusoidal voltage signals S135 and S315 are transmitted to inputs of multiplier circuit 206.

Multiplier circuits 203-206 generate 8 sinusoidal single-ended output voltage signals VOP0, VON0, VOP0_NXT, VON0_NXT, VOP90, VON90, VOP90_NXT, and VON90_NXT at 8 outputs of phase interpolator 200. The 8 output voltage signals VOP0, VON0, VOP0_NXT, VON0_NXT, VOP90, VON90, VOP90_NXT, and VON90_NXT have selected phase shifts relative to clock signal CLK0/CLK180. The 8 output voltage signals form 4 differential sinusoidal output voltage signals VOP0/VON0, VOP0_NXT/VON0_NXT, VOP90/VON90, and VOP90_NXT/VON90_NXT. Each of the differential sinusoidal output voltage signals VOP0/VON0, VOP0_NXT/VON0_NXT, VOP90/VON90, and VOP90_NXT/VON90_NXT is generated in response to 4 of the 8 sinusoidal voltage waveforms S0, S45, S90, S135, S180, S225, S270, and S315.

The phase of signal VOP0/VON0 is 90° ahead of the phase of signal VOP90/VON90. The phase of signal VOP0_NXT/VON0_NXT is 90° ahead of the phase of signal VOP90_NXT/VON90_NXT. The phase of signal VOP0_NXT/VON0_NXT is 360°/64 behind the phase of signal VOP0/VON0. The phase of signal VOP90_NXT/VON90_NXT is 360°/64 behind the phase of signal VOP90/VON90. The phases of signals VOP0/VON0, VOP0_NXT/VON0_NXT, VOP90/VON90, and VOP90_NXT/VON90_NXT are between 0° and 360° relative to the phase of CLK0/CLK180.

Control circuit block 210 generates digital control signals C0-C6, D0-D6, C0B-C6B, and D0B-D6B that control the current through multiplier circuits 203-206. Control signals C0B-C6B are the logical inverses (i.e., complements) of control signals C0-C6, respectively. Control signals D0B-D6B are the logical inverses (i.e., complements) of control signals D0-D6, respectively. Control signals C0-C6 and D0-D6 are transmitted to multiplier circuits 203 and 205, and control signals C0B-C6B and D0B-D6B are transmitted to multiplier circuits 204 and 206. Control circuit block 210 changes the currents through multiplier circuits 203-206 by varying the logic states of control signals C0-C6, D0-D6, C0B-C6B, and D0B-D6B. Control circuit block 210 varies the phase shifts of signals VOP0/VON0, VOP0_NXT/VON0_NXT, VOP90/VON90, and VOP90_NXT/VON90_NXT relative to CLK0/CLK180 by changing the current through multiplier circuits 203-206. Control circuit block 210 can include, for example, a state machine, a decoder circuit, or a counter circuit.

Control circuit 210 also generates 8 digital switch control signals R0-R7. Switch control signals R0-R7 control the conductive states of switch circuits in multiplier circuits 203-206. Switch control signals R0-R7 are transmitted to multiplier circuits 203-206.

The logic states of control signals C0-C6, C0B-C6B, D0-D6, D0B-D6B, and R0-R7 determine the phase shifts between output voltage signals VOP0/VON0, VOP0_NXT/VON0_NXT, VOP90/VON90, and VOP90_NXT/VON90_NXT and input clock signal CLK0/CLK180. Control circuit block 210 changes the logic states of one or more of control signals C0-C6, D0-D6, or R0-R7 to vary the phase shifts between CLK0/CLK180 and signals VOP0/VON0, VOP0_NXT/VON0_NXT, VOP90/VON90, and VOP90_NXT/VON90_NXT. Phase interpolator 200 can generate 64 different phase shifts from 0° and 360° between CLK0/CLK180 and each of the differential output signals VOP0/VON0, VOP0_NXT/VON0_NXT, VOP90/VON90, and VOP90_NXT/VON90_NXT.

Load circuit 208 provides a resistive load for slew rate circuits 201-202 and for multiplier circuits 203-206. Load circuit 208 has 8 resistors. Each of the 8 resistors is coupled between a different one of the output terminals of phase interpolator 200 at VOP0, VON0, VOP0_NXT, VON0_NXT, VOP90, VON90, VOP90_NXT, and VON90_NXT and a supply voltage VCC. The resistors in load circuit 208 can be, for example, passive resistors or field-effect transistors that are configured to have constant drain-to-source resistance values.

Figure 3A:
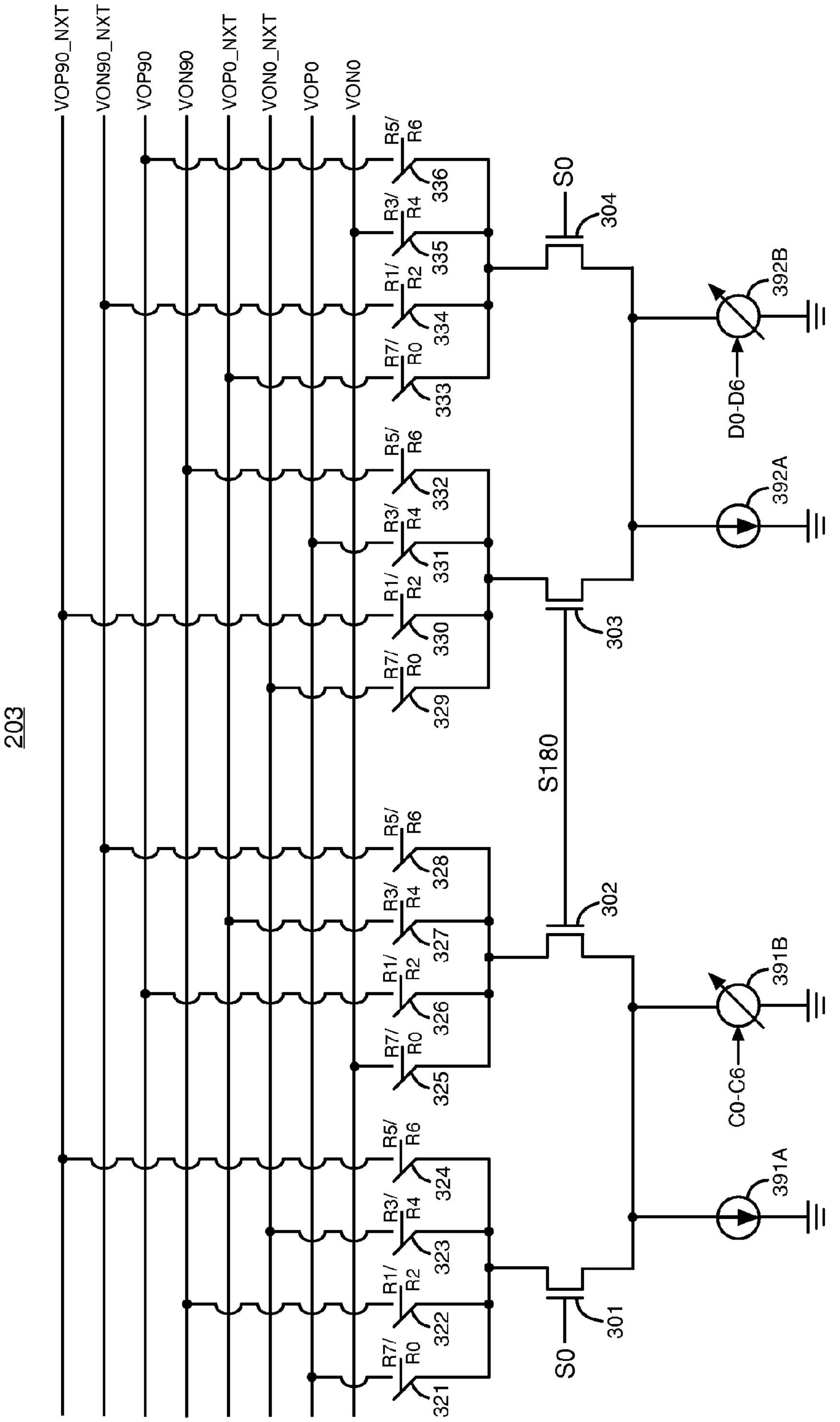
FIG. 3A illustrates an example of a first multiplier circuit shown in FIG. 2, according to an embodiment of the present invention.

FIG. 3A illustrates an example of multiplier circuit 203, according to an embodiment of the present invention. Multiplier circuit 203 includes n-channel metal oxide semiconductor field-effect transistors (MOSFETs) 301-304, switch circuits 321-336, constant current sources 391A and 392A, and variable current sources 391B and 392B.

Figure 3B:
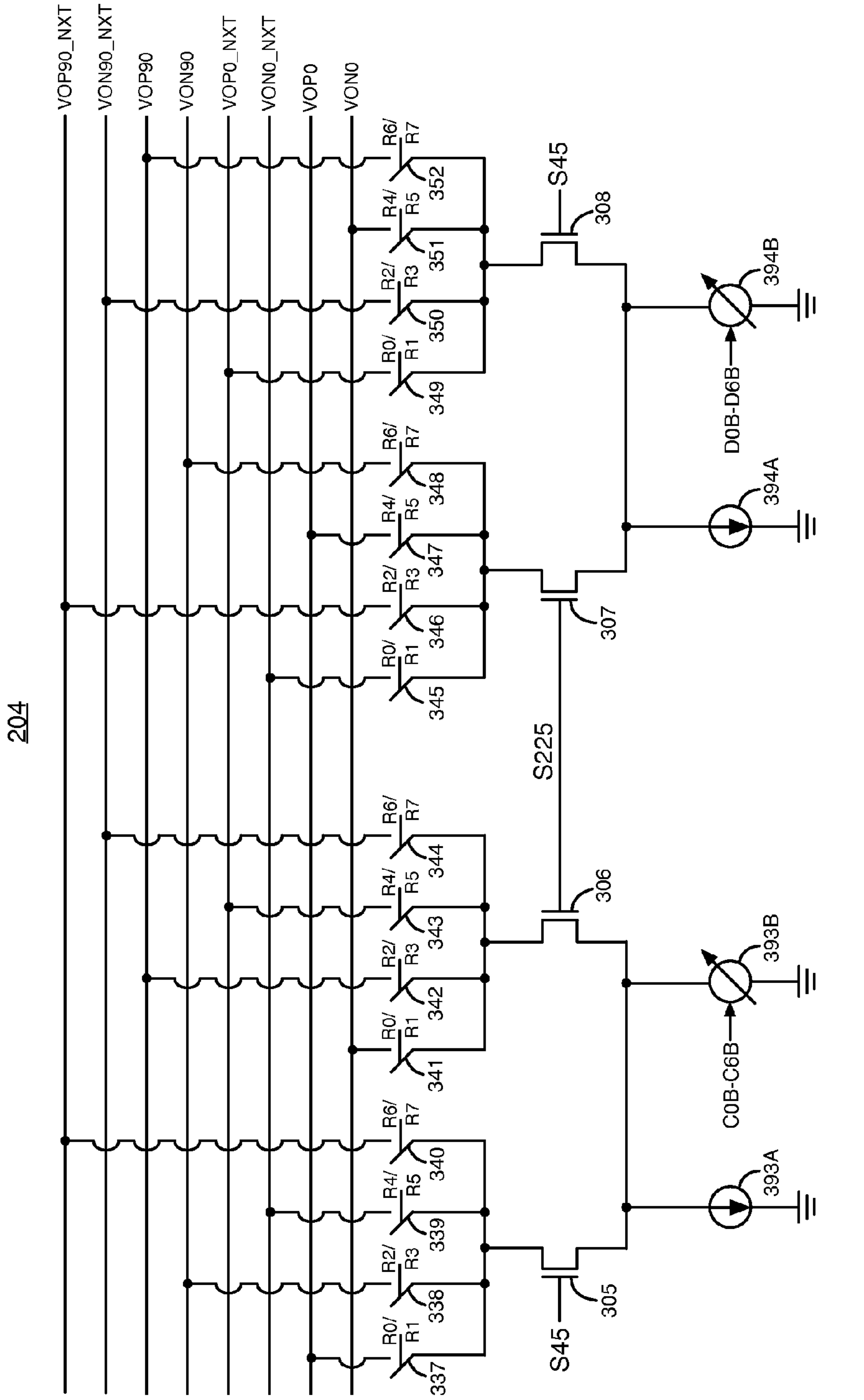
FIG. 3B illustrates an example of a second multiplier circuit shown in FIG. 2, according to an embodiment of the present invention.

FIG. 3B illustrates an example of multiplier circuit 204, according to an embodiment of the present invention. Multiplier circuit 204 includes n-channel MOSFETs 305-308, switch circuits 337-352, constant current sources 393A and 394A, and variable current sources 393B and 394B.

Figure 3C:
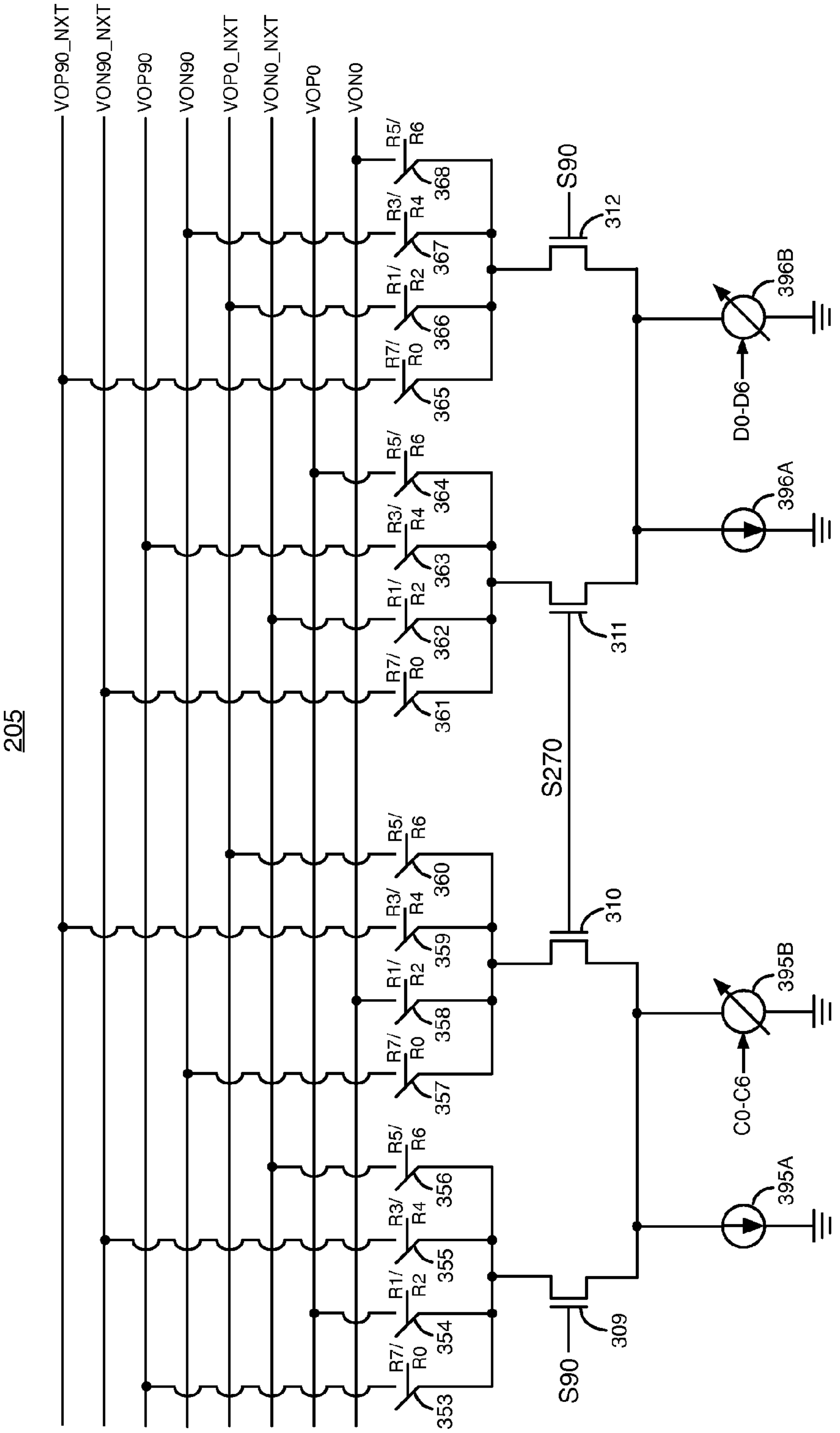
FIG. 3C illustrates an example of a third multiplier circuit shown in FIG. 2, according to an embodiment of the present invention.

FIG. 3C illustrates an example of multiplier circuit 205, according to an embodiment of the present invention. Multiplier circuit 205 includes n-channel MOSFETs 309-312, switch circuits 353-368, constant current sources 395A and 396A, and variable current sources 395B and 396B.

Figure 3D:
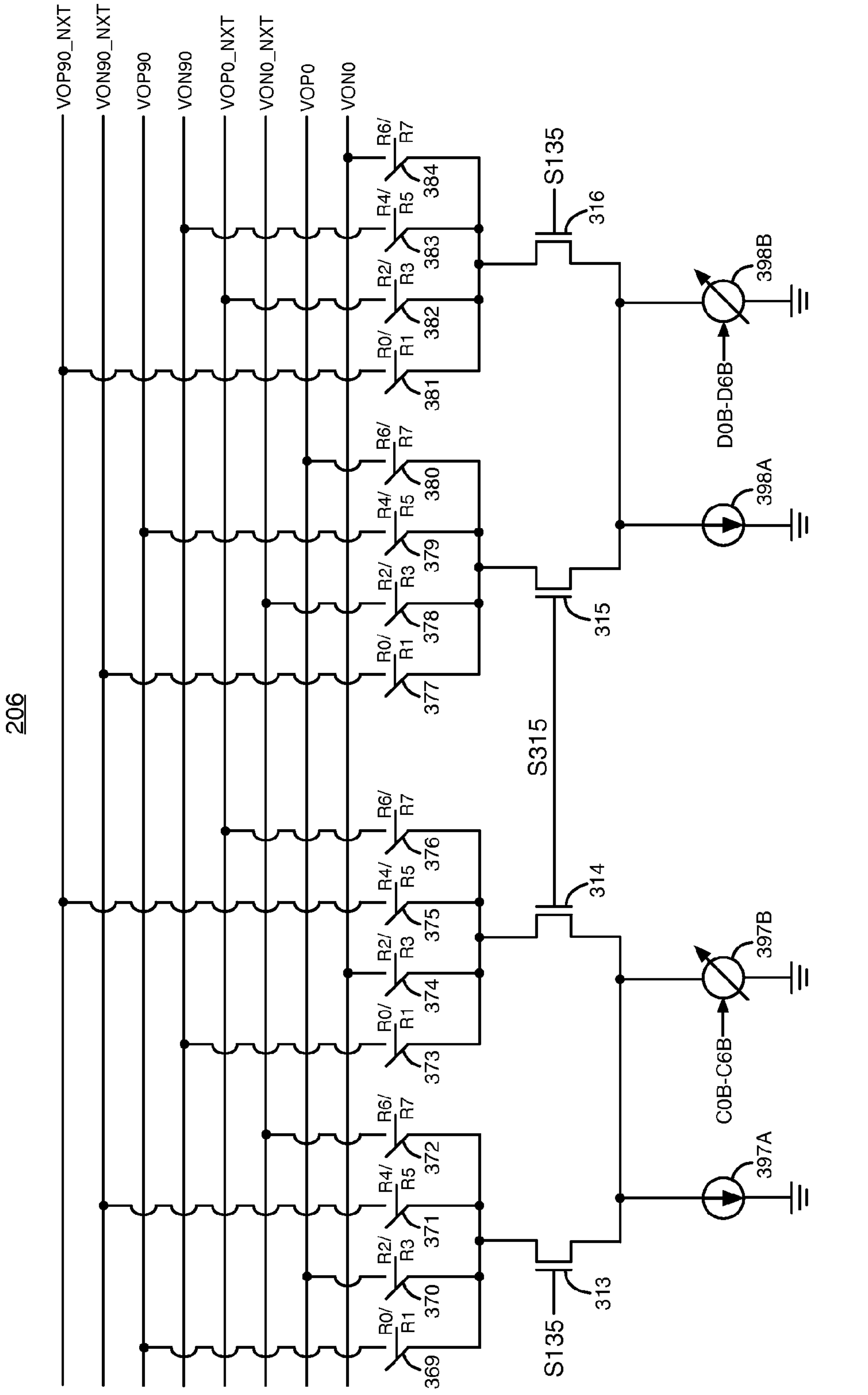
FIG. 3D illustrates an example of a fourth multiplier circuit shown in FIG. 2, according to an embodiment of the present invention.

FIG. 3D illustrates an example of multiplier circuit 206, according to an embodiment of the present invention. Multiplier circuit 206 includes n-channel MOSFETs 313-316, switch circuits 369-384, constant current sources 397A and 398A, and variable current sources 397B and 398B.

Multiplier circuits 203-206 include 8 differential pairs of transistors formed by transistors 301-302, transistors 303-304, transistors 305-306, transistors 307-308, transistors 309-310, transistors 311-312, transistors 313-314, and transistors 315-316. Each of the 8 output terminals of multiplier circuits 203-206 that provides one of the output signals VOP0, VON0, VOP0_NXT, VON0_NXT, VOP90, VON90, VOP90_NXT, and VON90_NXT is coupled to an active or passive load resistor in load circuit 208 shown in FIG. 2. Each of the load resistors receives a supply voltage VCC.

Figure 3E:
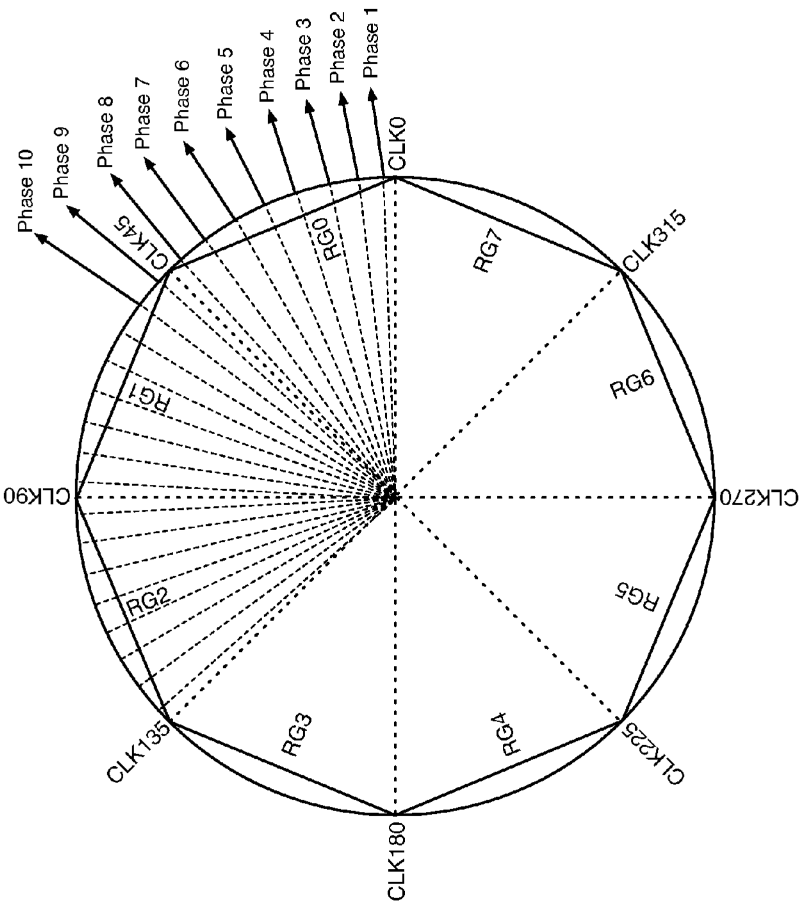
FIG. 3E is a rotator diagram that illustrates the 64 possible phases from 0° to 360° in an output signal of the phase interpolator of FIG. 2, according to an embodiment of the present invention.

The logic states of switch control signals R0-R7 and current control signals C0-C6, D0-D6, C0B-C6B, and D0B-D6B determine the phase shifts between CLK0/CLK180 and the output signals VOP0/VON0, VOP0_NXT/VON0_NXT, VOP90/VON90, and VOP90_NXT/VON90_NXT. FIG. 3E is a rotator diagram that illustrates 8 regions from 0° to 360°, according to an embodiment of the present invention. The 8 regions are labeled RG0-RG7 in FIG. 3E. Each of the 8 regions includes a 45° slice of a 360° circle. The relative phases of the input clock signals of phase interpolator 200 are also shown in FIG. 3E.

The phase shifts between CLK0/CLK180 and VOP0/VON0, VOP0_NXT/VON0_NXT, VOP90/VON90, and VOP90_NXT/VON90_NXT can be represented as angles in the rotator diagram of FIG. 3E. Multiplier circuits 203-206 generate phase shifts in VOP0/VON0, VOP0_NXT/VON0_NXT, VOP90/VON90, and VOP90_NXT/VON90_NXT relative to CLK0/CLK180 within the 8 regions RG0-RG7. The logic states of switch control signals R0-R7 determine which of the regions RG0-RG7 the phase shifts in VOP0/VON0, VOP0_NXT/VON0_NXT, VOP90/VON90, and VOP90_NXT/VON90_NXT occur in.

Digital switch control signals R0-R7 control the conductive states of switch circuits 321-384, as shown in FIGS. 3A-3D. Each of the switch circuits 321-384 is controlled by two of the switch control signals R0-R7. When both of the switch control signals R0-R7 that control a particular one of the switch circuits 321-384 are in logic high states, the switch circuit controlled by those two switch control signals is closed (i.e., it allows current flow through it). When at least one of the switch control signals R0-R7 that controls a particular one of the switch circuits 321-384 is in a logic low state, that switch circuit is open (i.e., it blocks current flow through it). Thus, an AND logic Boolean function is applied to the two switch control signals that control each of the switch circuits 321-384. The switch circuits described herein can be, for example, implemented by one or more field-effect transistors.

At any one time, only 3 of the switch control signals R0-R7 are in logic high states, and the remaining 5 switch control signals R0-R7 are in logic low states. The 3 switch control signals R0-R7 that are in logic high states cause switch circuits 321-384 to couple each of the differential pairs of transistors in multiplier circuits 203-206 to only two of the outputs of phase interpolator 200 that generate VOP0/VON0, VOP0_NXT/VON0_NXT, VOP90/VON90, and VOP90_NXT/VON90_NXT. The remaining 5 switch control signals R0-R7 that are in logic low states cause switch circuits 321-384 to decouple each of the differential pairs of transistors from the other six outputs of phase interpolator 200.

The three switch control signals R0-R7 that are in logic high states select the region of operation for the phases of VOP0/VON0, VOP0_NXT/VON0_NXT, VOP90/VON90, and VOP90_NXT/VON90_NXT. For example, when switch control signals R0, R1, and R7 are in logic high states, and switch control signals R2-R6 are in logic low states, switches 321, 325, 329, 333, 337, 341, 345, 349, 353, 357, 361, 365, 369, 373, 377, and 381 are closed (i.e., conduct current), and the remaining switches in multipliers 203-206 are open (i.e., in non-conductive states). Differential pairs 301-302 and 305-306 generate differential output voltage VOP0/VON0 in response to sinusoidal input signals S0, S45, S180 and S225. Differential pairs 303-304 and 307-308 generate differential output voltage VOP0_NXT/VON0_NXT in response to sinusoidal input signals S0, S45, S180 and S225. Phase interpolator 200 generates phase shifts in VOP0/VON0 and VOP0_NXT/VON0_NXT within region RG0 between 0° and 45°.

Also, when control signals R0, R1, and R7 are high, differential pairs 309-310 and 313-314 generate differential output voltage VOP90/VON90 in response to sinusoidal input signals S90, S135, S270, and S315. Differential pairs 311-312 and 315-316 generate differential output voltage VOP90_NXT/VON90_NXT in response to sinusoidal input signals S90, S135, S270, and S315. Phase interpolator 200 generates phase shifts in VOP90/VON90 and VOP90_NXT/VON90_NXT within region RG2 between 90° and 135°.

When switch control signals R0, R1, and R2 are in logic high states, and switch control signals R3-R7 are in logic low states, switches 322, 326, 330, 334, 337, 341, 345, 349, 354, 358, 362, 366, 369, 373, 377, and 381 are closed, and the remaining switches in multipliers 203-206 are open. Differential pairs 301-302 and 313-314 generate differential output voltage VOP90/VON90, differential pairs 303-304 and 315-316 generate VOP90_NXT/VON90_NXT, differential pairs 305-306 and 309-310 generate differential output voltage VOP0/VON0, and differential pairs 307-308 and 311-312 generate differential output voltage VOP0_NXT/VON0_NXT. Phase interpolator 200 generates phase shifts in VOP0/VON0 and VOP0_NXT/VON0_NXT within region RG1 between 45° and 90°, and phase interpolator 200 generates phase shifts in VOP90/VON90 and VOP90_NXT/VON90_NXT within region RG3 between 135° and 180°.

When switch control signals R1, R2, and R3 are in logic high states, and switch control signals R0 and R4-R7 are in logic low states, switches 322, 326, 330, 334, 338, 342, 346, 350, 354, 358, 362, 366, 370, 374, 378, and 382 are closed, and the remaining switches in multipliers 203-206 are open.

Phase interpolator 200 generates phase shifts in VOP0/VON0 and VOP0_NXT/VON0_NXT within region RG2 between 90° and 135°, and phase interpolator 200 generates phase shifts in VOP90/VON90 and VOP90_NXT/VON90_NXT in region RG4 between 180° and 225°.

When switch control signals R2, R3, and R4 are in logic high states, and switch control signals R0-R1 and R5-R7 are in logic low states, switches 323, 327, 331, 335, 338, 342, 346, 350, 355, 359, 363, 367, 370, 374, 378, and 382 are closed, and the remaining switches in multipliers 203-206 are open. Phase interpolator 200 generates phase shifts in VOP0/VON0 and VOP0_NXT/VON0_NXT within region RG3 between 135° and 180°, and phase interpolator 200 generates phase shifts in VOP90/VON90 and VOP90_NXT/VON90_NXT in region RG5 between 225° and 270°.

When switch control signals R3, R4, and R5 are in logic high states, and switch control signals R0-R2 and R6-R7 are in logic low states, switches 323, 327, 331, 335, 339, 343, 347, 351, 355, 359, 363, 367, 371, 375, 379, and 383 are closed, and the remaining switches in multipliers 203-206 are open. Phase interpolator 200 generates phase shifts in VOP0/VON0 and VOP0_NXT/VON0_NXT within region RG4 between 180° and 225°, and phase interpolator 200 generates phase shifts in VOP90/VON90 and VOP90_NXT/VON90_NXT in region RG6 between 270° and 315°.

When switch control signals R4, R5, and R6 are in logic high states, and switch control signals R0-R3 and R7 are in logic low states, switches 324, 328, 332, 336, 339, 343, 347, 351, 356, 360, 364, 368, 371, 375, 379, and 383 are closed, and the remaining switches in multipliers 203-206 are open. Phase interpolator 200 generates phase shifts in VOP0/VON0 and VOP0_NXT/VON0_NXT within region RG5 between 225° and 270°, and phase interpolator 200 generates phase shifts in VOP90/VON90 and VOP90_NXT/VON90_NXT in region RG7 between 315° and 0°.

When switch control signals R5, R6, and R7 are in logic high states, and switch control signals R0-R4 are in logic low states, switches 324, 328, 332, 336, 340, 344, 348, 352, 356, 360, 364, 368, 372, 376, 380, and 384 are closed, and the remaining switches in multipliers 203-206 are open. Phase interpolator 200 generates phase shifts in VOP0/VON0 and VOP0_NXT/VON0_NXT within region RG6 between 270° and 315°, and phase interpolator 200 generates phase shifts in VOP90/VON90 and VOP90_NXT/VON90_NXT in region RG0 between 0° and 45°.

When switch control signals R6, R7, and R0 are in logic high states, and switch control signals R1-R5 are in logic low states, switches 321, 325, 329, 333, 340, 344, 348, 352, 353, 357, 361, 365, 372, 376, 380, and 384 are closed, and the remaining switches in multipliers 203-206 are open. Phase interpolator 200 generates phase shifts in VOP0/VON0 and VOP0_NXT/VON0_NXT within region RG7 between 315° and 0°, and phase interpolator 200 generates phase shifts in VOP90/VON90 and VOP90_NXT/VON90_NXT in region RG1 between 45° and 90°.

Periodic input signals S0, S45, S90, S135, S180, S225, S270, and S315 are concurrently provided to the gates of transistors 301-316 at all times during the operation of phase interpolator 200, as shown in FIGS. 3A-3D.

The logic states of digital control signals C0-C6 determine the current through variable current sources 391B and 395B. The logic states of digital control signals C0B-C6B determine the current through variable current sources 393B and 397B. The logic states of digital control signals D0-D6 determine the current through variable current sources 392B and 396B. The logic states of digital control signals D0B-D6B determine the current through variable current sources 394B and 398B.

Each of the 8 variable current sources 391B-398B generates 8 different current values. Phase interpolator 200 generates 8 different phases in each of the output signals VOP0/VON0, VOP0_NXT/VON0_NXT, VOP90/VON90, and VOP90_NXT/VON90_NXT within each of the 8 regions RG0-RG7 by varying the currents through variable current sources 391B-398B between their 8 different current values and by varying the logic states of R0-R7. For example, the 8 current values of the variable current sources can generate phase 1, phase 2, phase 3, phase 4, phase 5, phase 6, phase 7, and phase 8 in VOP0/VON0 and VOP0_NXT/VON0_NXT between 0° and 45° within region RG0, as shown in FIG. 3E, when switch control signals R0, R1, and R7 are in logic high states.

Phase interpolator 200 generates 64 unique phases in each of its output signals VOP0/VON0, VOP0_NXT/VON0_NXT, VOP90/VON90, and VOP90_NXT/VON90_NXT between 0° and 360° by varying the logic states of control signals R0-R7, C0-C6, D0-D6, C0B-C6B, and D0B-D6B. The current values generated by variable current sources 391B-398B are varied by changing the logic states of control signals C0-C6, D0-D6, C0B-C6B, and D0B-D6B to generate different phase shifts in output signals VOP0/VON0, VOP0_NXT/VON0_NXT, VOP90/VON90, and VOP90_NXT/VON90_NXT within each region.

In one embodiment, control signals C0-C6, D0-D6, C0B-C6B, and D0B-D6B cause the phase of VOP0_NXT/VON0_NXT to be 5.625° (i.e., 360°/64) more than the phase of VOP0/VON0. Also, in this embodiment, control signals C0-C6, D0-D6, C0B-C6B, and D0B-D6B cause the phase of VOP90_NXT/VON90_NXT to be 5.625° (i.e., 360°/64) more than the phase of VOP90/VON90.

When phase interpolator 200 transitions from one of the regions RG0-RG7 to another one of the regions, current control signals C0-C6, D0-D6, C0B-C6B, and D0B-D6B cause the currents through variable current sources 391B-398B to remain constant.

In a particular embodiment of FIGS. 3A-3D, each of the variable current sources 391B, 392B, 393B, 394B, 395B, 396B, 397B, and 398B contains 7 current sources. The 7 current sources in each of variable current sources 391B-398B generate non-uniform relative currents of $I(1+2\Delta)$, $I(1+\Delta)$, I, $I(1-\Delta)$, I, $I(1+\Delta)$, and $I(1+2\Delta)$. I represents a first current value. $\Delta$ represents a second current value that is dependent on the phase shift $\theta$ in the output signal of phase interpolator 200, as shown below in equation (6).

The logic state of each of the control signals C0-C6 determines whether one of the 7 current sources in each of variable current sources 391B and 395B is coupled to or decoupled from the corresponding differential pair of transistors 301/302 or 309/310. The logic state of each of the control signals C0B-C6B determines whether one of the 7 current sources in each of variable current sources 393B and 397B is coupled to or decoupled from the corresponding differential pair of transistors 305/306 or 313-314. The logic state of each of the control signals D0-D6 determines whether one of the 7 current sources in each of variable current sources 392B and 396B is coupled to or decoupled from the corresponding differential pair of transistors 303/304 or 311/312. The logic state of each of the control signals D0B-D6B determines whether one of the 7 current sources in each of variable current sources 394B and 398B is coupled to or decoupled from the corresponding differential pair of transistors 307/308 or 315/316.

As mentioned above, the logic state of each signal C0B-C6B is the inverse of the logic state of each signal C0-C6, respectively, and the logic state of each signal D0B-D6B is the inverse of the logic state of each signal D0-D6, respectively. Thus, if C is the maximum current generated by each variable current source 391B-398B, and variable current sources 391B and 395B are each programmed to generate a current of D, then variable current sources 393B and 397B each generate a current of C-D. If variable current sources 392B and 396B are each programmed to generate a current of F, then variable current sources 394B and 398B each generate a current of C-F.

Figure 5:
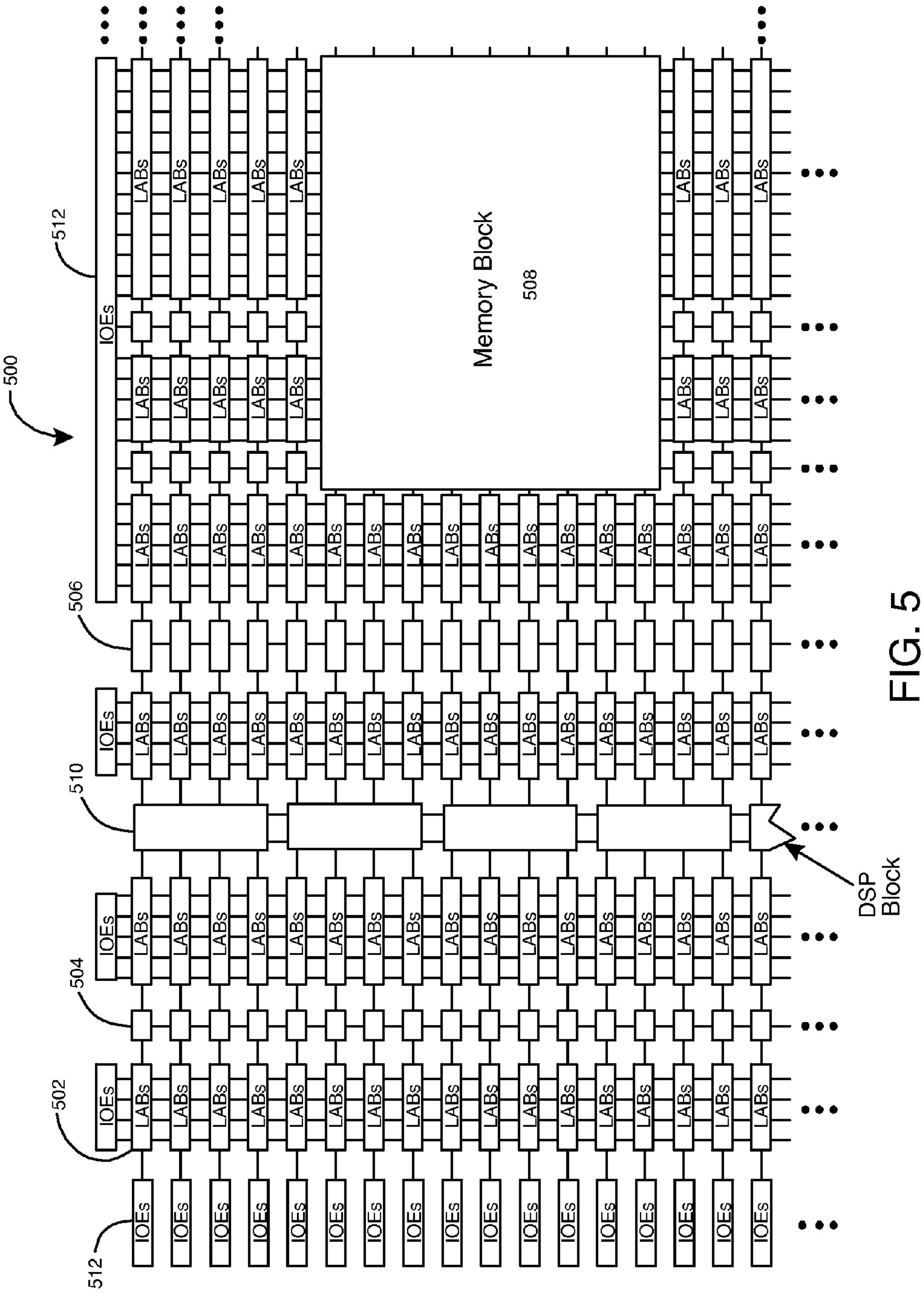
FIG. 5 is a simplified partial block diagram of a field programmable gate array (FPGA) that can include aspects of the present invention.

Further details of a variable current source that can be used to implement each of the variable current sources 391B-398B in phase interpolator 200 is shown in and described with respect to FIG. 5 of commonly-assigned U.S. patent application Ser. No. 12/537,634, by Ho et al., filed Aug. 7, 2009, which is incorporated by reference herein in its entirety. Each of the constant current sources 391A, 392A, 393A, 394A, 395A, 396A, 397A, and 398A in FIGS. 3A-3D generates a constant current that equals 0.5×I.

This embodiment improves the linearity of phase interpolator 200 at low frequency operation. This embodiment also causes the angles between adjacent phases in each of the output signals VOP0/VON0, VOP0_NXT/VON0_NXT, VOP90/VON90, and VOP90_NXT/VON90_NXT to be closer to the same value across each region RG0-RG7 and between regions RG0-RG7.

The transfer function of phase interpolator 200 is represented by the equations below in the embodiment in which variable current sources 391B-398B in FIGS. 3A-3D include the non-uniform current sources described above.

$$V_{OUT}=f(\alpha)\times\sin(\omega t)+f(\beta)\times\cos(\omega t)=c(\alpha,\beta)\times\sin(\omega t+\theta) \quad (4)$$

$$\theta=\arctan(f(\beta)/f(\alpha)) \quad (5)$$

$$f(\beta)/f(\alpha)=\tan(\theta)=f(f)=\Delta \quad (6)$$

In equation (4), $V_{OUT}$ equals one of the output signals VOP0/VON0, VOP0_NXT/VON0_NXT, VOP90/VON90, or VOP90_NXT/VON90_NXT of phase interpolator 200. In equation (5), arctan refers to the arctangent function, which is the inverse of the tangent function. In equation (6) tan refers to the tangent function. The target phase for $V_{OUT}$ can be obtained by controlling the two coefficients of equation (4) complementarily, as shown in equation (7).

$$f(\beta)+f(\alpha)=1 \quad (7)$$

Equations (8) and (9) below are obtained from equations (6) and (7), where cot refers to the cotangent function. In equations (4)-(9), $0\leqq f(\beta)\leqq 1$, and $0\leqq\theta\leqq\pi/4$.

$$f(\beta)=\frac{1}{1+\cot(\theta)} \quad (8)$$

$$f(\alpha)=\frac{\cot(\theta)}{1+\cot(\theta)} \quad (9)$$

Figure 4A:
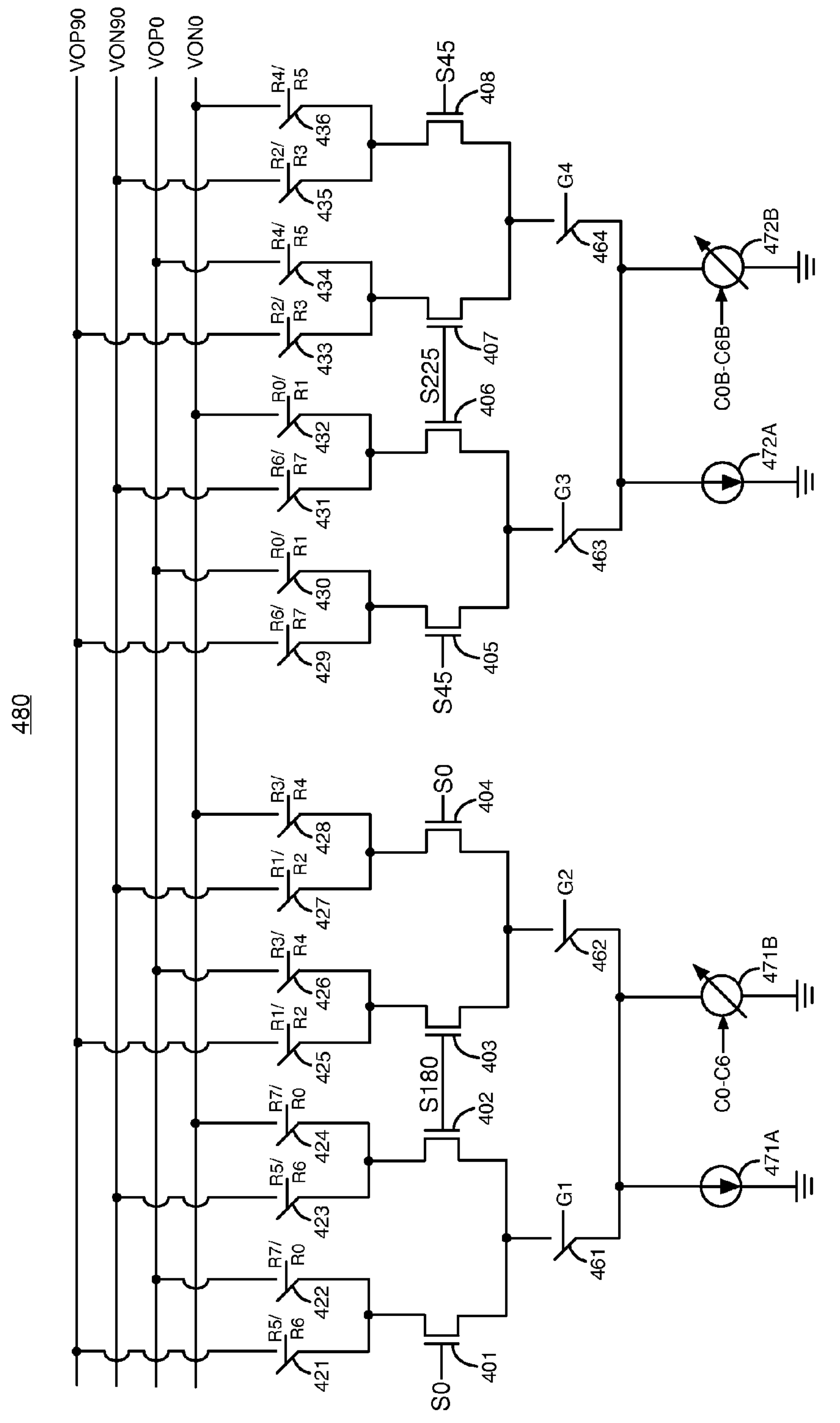
FIGS. 4A and 4B illustrate examples of multiplier circuits that generate phase shifts in two differential periodic output signals, according to an embodiment of the present invention.
Figure 4B:
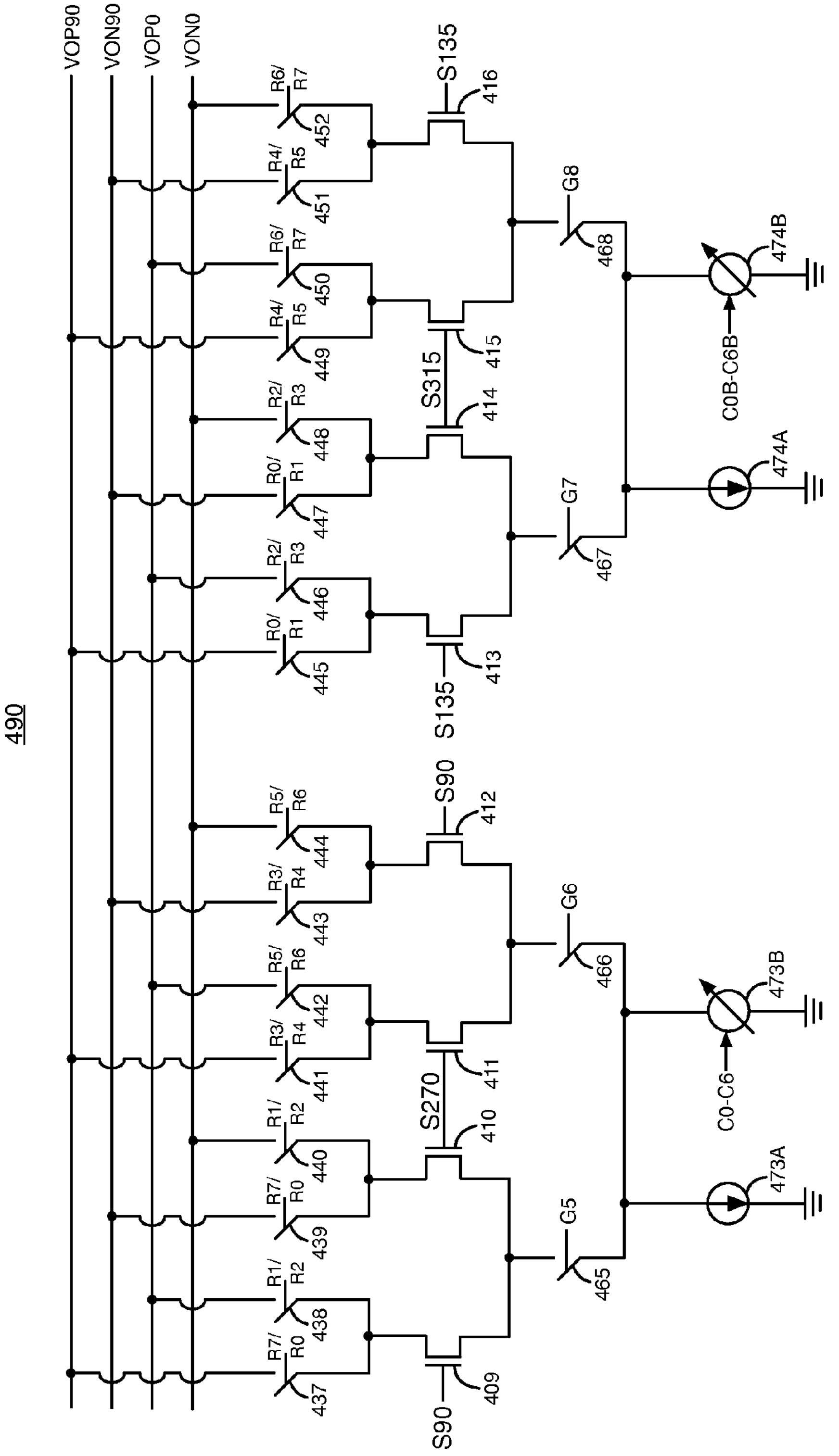

FIGS. 4A and 4B illustrate examples of multiplier circuits 480 and 490, respectively, that generate phase shifts in two differential periodic signals VOP0/VON0 and VOP90/VON90, according to an embodiment of the present invention. Multiplier circuits 480 and 490 can be used in a phase interpolator circuit to generate phase shifts in periodic output signals VOP0/VON0 and VOP90/VON90 in response to periodic input signals. The phase of signal VOP90/VON90 is 90° behind the phase of signal VOP0/VON0.

Multiplier circuit 480 shown in FIG. 4A includes n-channel MOSFETs 401-408, switch circuits 421-436 and 461-464, constant current sources 471A and 472A, and variable current sources 471B and 472B. Multiplier circuit 490 shown in FIG. 4B includes n-channel MOSFETs 409-416, switch circuits 437-452 and 465-468, constant current sources 473A and 474A, and variable current sources 473B and 474B.

The upper terminal of each of the switch circuits 421-452 shown in FIGS. 4A-4B is coupled to a first terminal of a load resistor in a load circuit, such as load circuit 208. A second terminal of each of the load resistors is at a supply voltage VCC. Sinusoidal input signals S0, S45, S90, S135, S180, S225, S270, and S315 are provided to the gates of the n-channel transistors as shown in FIGS. 4A-4B. Sinusoidal input signals S0, S45, S90, S135, S180, S225, S270, and S315 have relative phases of 0°, 45°, 90°, 135°, 180°, 225°, 270°, and 315°, respectively.

Multiplier circuits 480 and 490 generate two differential output voltage signals VOP0/VON0 and VOP90/VON90. The conductive wires shown in FIG. 4A that are at output voltages VOP0, VON0, VOP90, and VON90 are coupled to the conductive wires shown in FIG. 4B that are at output voltages VOP0, VON0, VOP90, and VON90, respectively. For example, switches 424, 428, 432, and 436 in multiplier 480 are coupled to switches 440, 444, 448, and 452 in multiplier 490.

The logic states of the switch control signals R0-R7 and the current control signals C0-C6 and C0B-C6B determine the relative phases of output signals VOP0/VON0 and VOP90/VON90. Multiplier circuits 480 and 490 generate phases in output signals VOP0/VON0 and VOP90/VON90 in 8 regions RG0-RG7 within the rotator diagram shown in FIG. 3E from 0° and 360°. The logic states of R0-R7, C0-C6, and C0B-C6B can be changed to adjust the phases of VOP0/VON0 and VOP90/VON90.

The conductive state of each of the switch circuits 421-452 is controlled by two of the switch control signals R0-R7. When both of the switch control signals R0-R7 that control a particular one of the switch circuits 421-452 are in logic high states, the switch circuit controlled by those two switch control signals is closed. When at least one of the switch control signals R0-R7 that controls a particular one of the switch circuits 421-452 is in a logic low state, that switch circuit is open. Thus, an AND logic Boolean function is applied to the switch control signals that control switches 421-452.

The conductive states of switch circuits 461-468 are controlled by 8 switch control signals G1-G8, respectively, as shown in FIGS. 4A-4B. The conductive states of switch circuits 461-468 are set based on the logic states of switch control signals G1-G8, as described in detail below.

When switch control signals R7 and R0-R1 are in logic high states, and switch control signals R2-R6 are in logic low states, switches 422, 424, 430, 432, 437, 439, 445, 447, 461, 463, 465, and 467 are closed, and the remaining switches in multiplier circuits 480 and 490 are open. Multiplier circuits 480 and 490 generate phase shifts in VOP0/VON0 in region RG0 between 0° and 45°, and multiplier circuits 480 and 490 generate phase shifts in VOP90/VON90 in region RG2 between 90° and 135°.

When switch control signals R0-R2 are in logic high states, and switch control signals R3-R7 are in logic low states, switches 425, 427, 430, 432, 438, 440, 445, 447, 462, 463, 465, and 467 are closed, and the remaining switches in multiplier circuits 480 and 490 are open. Multiplier circuits 480 and 490 generate phase shifts in VOP0/VON0 in region RG1 between 45° and 90°, and multiplier circuits 480 and 490 generate phase shifts in VOP90/VON90 in region RG3 between 135° and 180°.

When switch control signals R1-R3 are in logic high states, and switch control signals R0 and R4-R7 are in logic low states, switches 425, 427, 433, 435, 438, 440, 446, 448, 462, 464, 465, and 467 are closed, and the remaining switches in multiplier circuits 480 and 490 are open. Multiplier circuits 480 and 490 generate phase shifts in VOP0/VON0 in region RG2 between 90° and 135°, and multiplier circuits 480 and 490 generate phase shifts in VOP90/VON90 in region RG4 between 180° and 225°.

When switch control signals R2-R4 are in logic high states, and switch control signals R0-R1 and R5-R7 are in logic low states, switches 426, 428, 433, 435, 441, 443, 446, 448, 462, 464, 466, and 467 are closed, and the remaining switches in multiplier circuits 480 and 490 are open. Multiplier circuits 480 and 490 generate phase shifts in VOP0/VON0 in region RG3 between 135° and 180°, and multiplier circuits 480 and 490 generate phase shifts in VOP90/VON90 in region RG5 between 225° and 270°.

When switch control signals R3-R5 are in logic high states, and switch control signals R0-R2 and R6-R7 are in logic low states, switches 426, 428, 434, 436, 441, 443, 449, 451, 462, 464, 466, and 468 are closed, and the remaining switches in multiplier circuits 480 and 490 are open. Multiplier circuits 480 and 490 generate phase shifts in VOP0/VON0 in region RG4 between 180° and 225°, and multiplier circuits 480 and 490 generate phase shifts in VOP90/VON90 in region RG6 between 270° and 315°.

When switch control signals R4-R6 are in logic high states, and switch control signals R0-R3 and R7 are in logic low states, switches 421, 423, 434, 436, 442, 444, 449, 451, 461, 464, 466, and 468 are closed, and the remaining switches in multiplier circuits 480 and 490 are open. Multiplier circuits 480 and 490 generate phase shifts in VOP0/VON0 in region RG5 between 225° and 270°, and multiplier circuits 480 and 490 generate phase shifts in VOP90/VON90 in region RG7 between 315° and 0°.

When switch control signals R5-R7 are in logic high states, and switch control signals R0-R4 are in logic low states, switches 421, 423, 429, 431, 442, 444, 450, 452, 461, 463, 466, and 468 are closed, and the remaining switches in multiplier circuits 480 and 490 are open. Multiplier circuits 480 and 490 generate phase shifts in VOP0/VON0 in region RG6 between 270° and 315°, and multiplier circuits 480 and 490 generate phase shifts in VOP90/VON90 in region RG0 between 0° and 45°.

When switch control signals R0 and R6-R7 are in logic high states, and switch control signals R1-R5 are in logic low states, switches 422, 424, 429, 431, 437, 439, 450, 452, 461, 463, 465, and 468 are closed, and the remaining switches in multiplier circuits 480 and 490 are open. Multiplier circuits 480 and 490 generate phase shifts in VOP0/VON0 in region RG7 between 315° and 0°, and multiplier circuits 480 and 490 generate phase shifts in VOP90/VON90 in region RG1 between 45° and 90°.

The logic states of digital control signals C0-C6 determine the current through variable current sources 471B and 473B. The logic states of digital control signals C0B-C6B determine the current through variable current sources 472B and 474B. The logic state of each current control signal C0B-C6B is the inverse of the logic state of each current control signal C0-C6, respectively.

Variable current sources 471B-474B each generate 8 different current values. Multiplier circuits 480 and 490 generate 8 different phases in each of the output signals VOP0/VON0 and VOP90/VON90 within each of the 8 regions RG0-RG7 by varying the currents through variable current source 471B-474B and by varying the logic states of control signals R0-R7 and G1-G8. Multiplier circuits 480 and 490 generate 64 unique phases in each of the output signals VOP0/VON0 and VOP90/VON90 between 0° and 360° by varying the logic states of control signals R0-R7, G1-G8, C0-C6, and C0B-C6B.

The current values generated by variable current sources 471B-474B are varied by changing the logic states of control signals C0-C6 and C0B-C6B to generate different phase shifts in output signals VOP0/VON0 and VOP90/VON90. In one embodiment of FIGS. 4A-4B, each of the variable current sources 471B, 472B, 473B, and 474B contains 7 current sources that generate non-uniform currents as shown in and described with respect to FIG. 5 of U.S. patent application Ser. No. 12/537,634.

According to other embodiments, multiplier circuits 480 and 490 can be modified to generate output signals VOP0/VON0 and VOP0_NXT/VON0_NXT, or VOP90/VON90 and VOP90_NXT/VON90_NXT, or VOP0/VON0 and VOP90_NXT/VON90, or VOP0_NXT/VON0_NXT and VOP90/VON90 by connecting switch circuits 421-452 as shown in FIGS. 3A-3D to generate the appropriate output signals.

FIG. 5 is a simplified partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 500 includes a two-dimensional array of programmable logic array blocks (or LABs) 502 that are interconnected by a network of column and row interconnect conductors of varying length and speed. LABs 502 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including random access memory (RAM) blocks of varying sizes provided throughout the array. The RAM blocks include, for example, blocks 504, blocks 506, and block 508. These memory blocks can also include shift registers and first-in-first-out (FIFO) buffers.

FPGA 500 further includes digital signal processing (DSP) blocks 510 that can implement, for example, multipliers with add or subtract features. Input/output elements (IOEs) 512 located, in this example, around the periphery of the chip, support numerous single-ended and differential input/output standards. IOEs 512 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 500 is described herein for illustrative purposes only and that the present invention can be implemented in many different types of integrated circuits.

Figure 6:
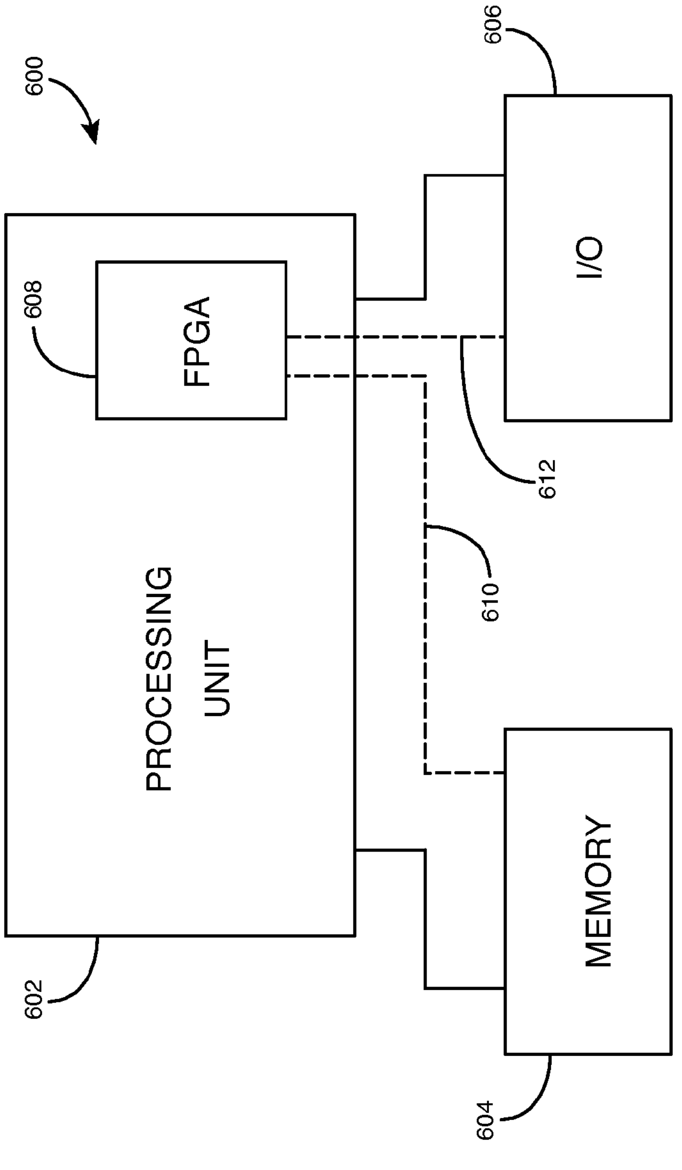
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an input/output (I/O) unit 606 interconnected together by one or more buses. According to this exemplary embodiment, an FPGA 608 is embedded in processing unit 602. FPGA 608 can serve many different purposes within the system of FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar functions. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor that can be reprogrammed as needed to handle a particular computing task. Alternatively, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase interpolator circuit comprising:

a first differential pair comprising a first transistor and a second transistor, wherein the first transistor is coupled to the second transistor;

a load circuit;

a first set of switch circuits coupled between the first transistor and the load circuit, wherein the first set of switch circuits comprises at least three switch circuits that are each coupled to a drain of the first transistor;

a second set of switch circuits coupled between the second transistor and the load circuit, wherein the second set of switch circuits comprises at least three switch circuits that are each coupled to a drain of the second transistor; and a first current source operable to provide current to the first differential pair.

2. The phase interpolator circuit of claim 1 further comprising:

a second differential pair comprising a third transistor and a fourth transistor, wherein the third transistor is coupled to the fourth transistor;

a third set of switch circuits coupled between the third transistor and the load circuit; and a fourth set of switch circuits coupled between the fourth transistor and the load circuit.

3. The phase interpolator circuit of claim 2 further comprising:

a third differential pair comprising a fifth transistor and a sixth transistor, wherein the fifth transistor is coupled to the sixth transistor;

a fourth differential pair comprising a seventh transistor and an eighth transistor, wherein the seventh transistor is coupled to the eighth transistor;

a fifth set of switch circuits coupled between the fifth transistor and the load circuit;

a sixth set of switch circuits coupled between the sixth transistor and the load circuit;

a seventh set of switch circuits coupled between the seventh transistor and the load circuit;

an eighth set of switch circuits coupled between the eighth transistor and the load circuit; and a second current source operable to provide current to the third and the fourth differential pairs.

4. The phase interpolator circuit of claim 1 wherein the first set of switch circuits comprises four switch circuits that are each coupled to a drain of the first transistor, and wherein the second set of switch circuits comprises four switch circuits that are each coupled to a drain of the second transistor.

5. The phase interpolator circuit of claim 4 further comprising:

a second differential pair comprising a third transistor and a fourth transistor, wherein the third transistor is coupled to the fourth transistor;

a third set of at least four switch circuits that are coupled between a drain of the third transistor and the load circuit;

a fourth set of at least four switch circuits that are coupled between a drain of the fourth transistor and the load circuit, wherein the first current source is a first variable current source; and a second variable current source operable to provide current to the second differential pair.

6. The phase interpolator circuit of claim 5 further comprising:

a third differential pair comprising a fifth transistor and a sixth transistor, wherein the fifth transistor is coupled to the sixth transistor;

a fourth differential pair comprising a seventh transistor and an eighth transistor, wherein the seventh transistor is coupled to the eighth transistor;

a fifth set of at least four switch circuits that are coupled between a drain of the fifth transistor and the load circuit;

a sixth set of at least four switch circuits that are coupled between a drain of the sixth transistor and the load circuit;

a seventh set of at least four switch circuits that are coupled between a drain of the seventh transistor and the load circuit;

an eighth set of at least four switch circuits that are coupled between a drain of the eighth transistor and the load circuit;

a third variable current source operable to provide current to the third differential pair; and a fourth variable current source operable to provide current to the fourth differential pair.

7. The phase interpolator circuit of claim 6 further comprising:

a fifth differential pair comprising a ninth transistor and a tenth transistor, wherein the ninth transistor is coupled to the tenth transistor;

a sixth differential pair comprising an eleventh transistor and a twelfth transistor, wherein the eleventh transistor is coupled to the twelfth transistor;

a ninth set of at least four switch circuits that are coupled between a drain of the ninth transistor and the load circuit;

a tenth set of at least four switch circuits that are coupled between a drain of the tenth transistor and the load circuit;

an eleventh set of at least four switch circuits that are coupled between a drain of the eleventh transistor and the load circuit;

a twelfth set of at least four switch circuits that are coupled between a drain of the twelfth transistor and the load circuit;

a fifth variable current source operable to provide current to the fifth differential pair; and a sixth variable current source operable to provide current to the sixth differential pair.

8. The phase interpolator circuit of claim 7 further comprising:

a seventh differential pair comprising a thirteenth transistor and a fourteenth transistor, wherein the thirteenth transistor is coupled to the fourteenth transistor;

an eighth differential pair comprising a fifteenth transistor and a sixteenth transistor, wherein the fifteenth transistor is coupled to the sixteenth transistor;

a thirteenth set of at least four switch circuits that are coupled between a drain of the thirteenth transistor and the load circuit;

a fourteenth set of at least four switch circuits that are coupled between a drain of the fourteenth transistor and the load circuit;

a fifteenth set of at least four switch circuits that are coupled between a drain of the fifteenth transistor and the load circuit;

a sixteenth set of at least four switch circuits that are coupled between a drain of the sixteenth transistor and the load circuit;

a seventh variable current source operable to provide current to the seventh differential pair; and an eighth variable current source operable to provide current to the eighth differential pair.

9. The phase interpolator circuit of claim 2 further comprising:

a first switch coupled between the first differential pair and the first current source; and a second switch coupled between the second differential pair and the first current source.

10. The phase interpolator circuit of claim 1 wherein a conductive state of each of the switch circuits in the first and the second sets of switch circuits is controlled by two control signals.

11. A phase interpolator circuit comprising:

a first differential pair comprising a first transistor and a second transistor, wherein the first transistor is coupled to the second transistor;

a second differential pair comprising a third transistor and a fourth transistor, wherein the third transistor is coupled to the fourth transistor;

a first switch circuit coupled to the first transistor;

a second switch circuit coupled between the first switch circuit and the third transistor;

a third switch circuit coupled to the second transistor;

a fourth switch circuit coupled between the third switch circuit and the fourth transistor;

a fifth switch circuit coupled to the first transistor;

a sixth switch circuit coupled between the fifth switch circuit and the third transistor;

a seventh switch circuit coupled to the second transistor; and an eighth switch circuit coupled between the seventh switch circuit and the fourth transistor.

12. The phase interpolator circuit of claim 11 further comprising:

a ninth switch circuit coupled to the first transistor;

a tenth switch circuit coupled between the ninth switch circuit and the third transistor;

an eleventh switch circuit coupled to the second transistor;

a twelfth switch circuit coupled between the eleventh switch circuit and the fourth transistor;

a thirteenth switch circuit coupled to the first transistor;

a fourteenth switch circuit coupled between the thirteenth switch circuit and the third transistor;

a fifteenth switch circuit coupled to the second transistor; and a sixteenth switch circuit coupled between the fifteenth switch circuit and the fourth transistor.

13. The phase interpolator circuit of claim 12 further comprising:

a third differential pair comprising a fifth transistor and a sixth transistor, wherein the fifth transistor is coupled to the sixth transistor;

a fourth differential pair comprising a seventh transistor and an eighth transistor, wherein the seventh transistor is coupled to the eighth transistor;

a seventeenth switch circuit coupled to the fifth transistor;

an eighteenth switch circuit coupled between the seventeenth switch circuit and the seventh transistor;

a nineteenth switch circuit coupled to the sixth transistor;

a twentieth switch circuit coupled between the nineteenth switch circuit and the eighth transistor;

a twenty-first switch circuit coupled to the fifth transistor;

a twenty-second switch circuit coupled between the twenty-first switch circuit and the seventh transistor;

a twenty-third switch circuit coupled to the sixth transistor; and a twenty-fourth switch circuit coupled between the twenty-third switch circuit and the eighth transistor.

14. The phase interpolator circuit of claim 13 further comprising:

a twenty-fifth switch circuit coupled to the fifth transistor;

a twenty-sixth switch circuit coupled between the twenty-fifth switch circuit and the seventh transistor;

a twenty-seventh switch circuit coupled to the sixth transistor;

a twenty-eighth switch circuit coupled between the twenty-seventh switch circuit and the eighth transistor;

a twenty-ninth switch circuit coupled to the fifth transistor;

a thirtieth switch circuit coupled between the twenty-ninth switch circuit and the seventh transistor;

a thirty-first switch circuit coupled to the sixth transistor; and a thirty-second switch circuit coupled between the thirty-first switch circuit and the eighth transistor.

15. The phase interpolator circuit of claim 13 further comprising:

a fifth differential pair comprising a ninth transistor and a tenth transistor, wherein the ninth transistor is coupled to the tenth transistor;

a first set of switches coupled to the ninth transistor;

a second set of switches coupled to the tenth transistor;

a sixth differential pair comprising an eleventh transistor and a twelfth transistor, wherein the eleventh transistor is coupled to the twelfth transistor;

a third set of switches coupled to the eleventh transistor; and a fourth set of switches coupled to the twelfth transistor.

16. The phase interpolator circuit of claim 11 further comprising:

a first variable current source circuit coupled to the first differential pair; and a second variable current source circuit coupled to the second differential pair.

17. A method for generating periodic signals using a phase interpolator, the method comprising:

generating first and second periodic output signals in response to first, second, third, and fourth periodic input signals using first and second differential pairs of transistors at a first time;

generating third and fourth periodic output signals in response to the first, the second, the third, and the fourth periodic input signals using third and fourth differential pairs of transistors at the first time;

generating the first and the second periodic output signals in response to fifth, sixth, seventh, and eighth periodic input signals using fifth and sixth differential pairs of transistors at a second time; and generating the third and the fourth periodic output signals in response to the fifth, the sixth, the seventh, and the eighth periodic input signals using seventh and eighth differential pairs of transistors at the second time.

18. The method of claim 17 further comprising:

varying a first current provided to the first differential pair of transistors and varying a second current provided to the second differential pair of transistors to adjust phases of the first and the second periodic output signals;

varying a third current provided to the third differential pair of transistors and varying a fourth current provided to the fourth differential pair of transistors to adjust phases of the third and the fourth periodic output signals;

varying a fifth current provided to the fifth differential pair of transistors and varying a sixth current provided to the sixth differential pair of transistors to adjust phases of the first and the second periodic output signals; and varying a seventh current provided to the seventh differential pair of transistors and varying an eighth current provided to the eighth differential pair of transistors to adjust phases of the third and the fourth periodic output signals.

19. The method of claim 17 further comprising:

generating fifth and sixth periodic output signals in response to the first, the second, the third, and the fourth periodic input signals using the first and the second differential pairs of transistors at the second time;

generating seventh and eighth periodic output signals in response to the first, the second, the third, and the fourth periodic input signals using the third and the fourth differential pairs of transistors at the second time;

generating the fifth and the sixth periodic output signals in response to the fifth, the sixth, the seventh, and the eighth periodic input signals using the fifth and the sixth differential pairs of transistors at the first time; and generating the seventh and the eighth periodic output signals in response to the fifth, the sixth, the seventh, and the eighth periodic input signals using the seventh and the eighth differential pairs of transistors at the first time.

20. A phase interpolator circuit comprising:

first and second differential pairs of transistors; and third and fourth differential pairs of transistors, wherein the first differential pair of transistors and the second differential pair of transistors are operable to generate first and second periodic output signals based on first, second, third, and fourth periodic input signals, and wherein the third differential pair of transistors and the fourth differential pair of transistors are operable to generate third and fourth periodic output signals based on the first, the second, the third, and the fourth periodic input signals, wherein the phase interpolator circuit concurrently generates the first, the second, the third, and the fourth periodic output signals at four different outputs.

21. The phase interpolator circuit of claim 20 further comprising:

fifth and fourth sixth differential pairs of transistors; and seventh and eighth differential pairs of transistors, wherein the fifth differential pair of transistors and the sixth differential pair of transistors are operable to generate fifth and sixth periodic output signals based on fifth, sixth, seventh, and eighth periodic input signals, and wherein the seventh differential pair of transistors and the eighth differential pair of transistors are operable to generate seventh and eighth periodic output signals based on the fifth, the sixth, the seventh, and the eighth periodic input signals, wherein the phase interpolator circuit concurrently generates the first, the second, the third, the fourth, the fifth, the sixth, the seventh, and the eighth periodic output signals at eight different outputs.

22. The phase interpolator circuit of claim 11, wherein the first and the second switch circuits are coupled to a first output, wherein the third and the fourth switch circuits are coupled to a second output, wherein the fifth and the sixth switch circuits are coupled to a third output wherein the seventh and the eighth switch circuits are coupled to a fourth output, and wherein the phase interpolator circuit concurrently generates four different output signals at the first, the second, the third, and the fourth outputs.

23. The phase interpolator circuit of claim 22 further comprising:

a third differential pair comprising a fifth transistor and a sixth transistor, wherein the fifth transistor is coupled to the sixth transistor;

a fourth differential pair comprising a seventh transistor and an eighth transistor, wherein the seventh transistor is coupled to the eighth transistor;

a ninth switch circuit coupled between the fifth transistor and the first output;

a tenth switch circuit coupled between the first output and the seventh transistor;

an eleventh switch circuit coupled between the fifth transistor and the third output;

a twelfth switch circuit coupled between the third output and the seventh transistor;

a thirteenth switch circuit coupled between the sixth transistor and the second output;

a fourteenth switch circuit coupled between the second output and the eighth transistor;

a fifteenth switch circuit coupled between the sixth transistor and the fourth output; and a sixteenth switch circuit coupled between the fourth output and the eighth transistor.

* * * * *